US009502080B2

(12) United States Patent
Douzaka

(10) Patent No.: US 9,502,080 B2
(45) Date of Patent: Nov. 22, 2016

(54) SEMICONDUCTOR MEMORY DEVICE

(71) Applicant: KABUSHIKI KAISHA TOSHIBA, Tokyo (JP)

(72) Inventor: Toshiaki Douzaka, Yokohama Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/473,688

(22) Filed: Aug. 29, 2014

(65) Prior Publication Data
US 2015/0262627 A1 Sep. 17, 2015

(30) Foreign Application Priority Data
Mar. 13, 2014 (JP) ................................. 2014-050864

(51) Int. Cl.
G11C 5/06 (2006.01)
G11C 5/10 (2006.01)
G11C 7/18 (2006.01)
G11C 17/12 (2006.01)
G11C 7/12 (2006.01)

(52) U.S. Cl.
CPC . G11C 5/10 (2013.01); G11C 7/18 (2013.01); G11C 17/12 (2013.01); *G11C 7/12* (2013.01)

(58) Field of Classification Search
CPC ............ G11C 11/404; G11C 11/4074; G11C 11/401; G11C 17/12; G11C 29/28; G11C 29/80; G11C 7/065; G11C 7/1051; G11C 8/06; G11C 11/40603; G11C 11/4096; G11C 11/5642; G11C 8/12; G11C 11/161; G11C 8/16

USPC .............. 365/149, 230.03, 207, 208, 230.01, 365/171, 185.13, 189.011, 189.14, 94
See application file for complete search history.

(56) References Cited

U.S. PATENT DOCUMENTS

| 3,978,459 | A  | * | 8/1976  | Koo     | G11C 11/4091 365/154 |
| 2005/0213362 | A1 | * | 9/2005 | Chang   | G11C 11/5692 365/104 |
| 2006/0158935 | A1 | * | 7/2006 | Chan    | G11C 7/062 365/185.17 |
| 2013/0343113 | A1 | * | 12/2013 | Matsuda | G11C 11/1675 365/69 |

FOREIGN PATENT DOCUMENTS

JP H02005298 A 1/1990
(Continued)

OTHER PUBLICATIONS

Taiwan Office Action dated Jan. 19, 2016, filed in Taiwan counterpart Application No. 103132404, 7 pages (with translation).
(Continued)

*Primary Examiner* — Thong Q Le
(74) *Attorney, Agent, or Firm* — Patterson & Sheridan, LLP

(57) ABSTRACT

According to one embodiment, a semiconductor memory device includes a memory cell array in which memory cells are disposed in a matrix, each memory cell being connectable to any one of a plurality of bit lines, and a capacitance that suppresses coupling noise among the plurality of bit lines, the capacitance being added to at least one of the plurality of bit lines.

19 Claims, 8 Drawing Sheets

(56) References Cited

FOREIGN PATENT DOCUMENTS

| | | |
|---|---|---|
| JP | H05062490 A | 3/1993 |
| JP | 2001266585 A | 9/2001 |
| JP | 2005141812 A | 6/2005 |
| JP | 2013-069806 A | 4/2013 |

OTHER PUBLICATIONS

Ching-Wei Wu et al., A 28nm ROM with Two-Step Decoding Scheme and OD-Space-Effect Minimization to Achieve 30% Speed and 190mV Vmin Improvement, Symposium on VLSI Circuits Digest of Technical Papers, 2013, 2 pages.

Taiwan Office Action dated Jul. 7, 2016, filed in Taiwan counterpart Application No. 103132404, 11 pages (with translation).

* cited by examiner

| BL_A | BL_B | BL_C | Out0 | Out1 |
|------|------|------|------|------|
| 1 | 1 | 1 | 1 | 1 |
| 0 | 1 | 1 | 0 | 1 |
| 1 | 0 | 1 | 1 | 0 |
| 1 | 1 | 0 | 0 | 0 |

| BL_A | BL_B | BL_C | Out0 | Out1 |
|------|------|------|------|------|
| 1 | 1 | 1 | 1 | 1 |
| 0 | 1 | 1 | 0 | 1 |
| 1 | 0 | 1 | 0 | 0 |
| 1 | 1 | 0 | 1 | 0 |

SEMICONDUCTOR MEMORY DEVICE

CROSS-REFERENCE TO RELATED APPLICATION

This application is based upon and claims the benefit of priority from Japanese Patent Application No. 2014-050864, filed Mar. 13, 2014, the entire contents of which are incorporated herein by reference.

FIELD

Embodiments described herein relate generally to a semiconductor memory device that stores multivalued data.

BACKGROUND

It is known that the operation speed of mask ROM depends on the gate width of a cell transistor. Since the gate width is increased as the number of bit lines connected to one cell transistor is increased, it is possible to improve the operation speed. Therefore, for example, mask ROM that connects three bit lines to one cell transistor and stores four-valued data based on whether or not each bit line is connected to the cell transistor has been proposed.

However, if a plurality of bit lines is connected to one cell transistor, the potential of adjacent bit lines can be altered due to the influence of the coupling noise between the plurality of bit lines. In particular, with current mask ROM devices, which are driven at a low voltage, there is a possibility that the value exceeds the operation threshold value of a next-stage circuit as a result of potential fluctuations of the adjacent bit line, which may cause an unintended activation.

DETAILED DESCRIPTION

Embodiments provide a semiconductor memory device having reduced fluctuations in a bit line that are caused by the coupling noise between adjacent bit lines.

In general, according to one embodiment, a semiconductor memory device includes: a memory cell array in which memory cells are disposed in a matrix, each memory cell being connectable to any one of a plurality of bit lines; and a capacitance that suppresses coupling noise among the plurality of bit lines, the capacitance being added to at least one of the plurality of bit lines.

First Embodiment

Figure 1:
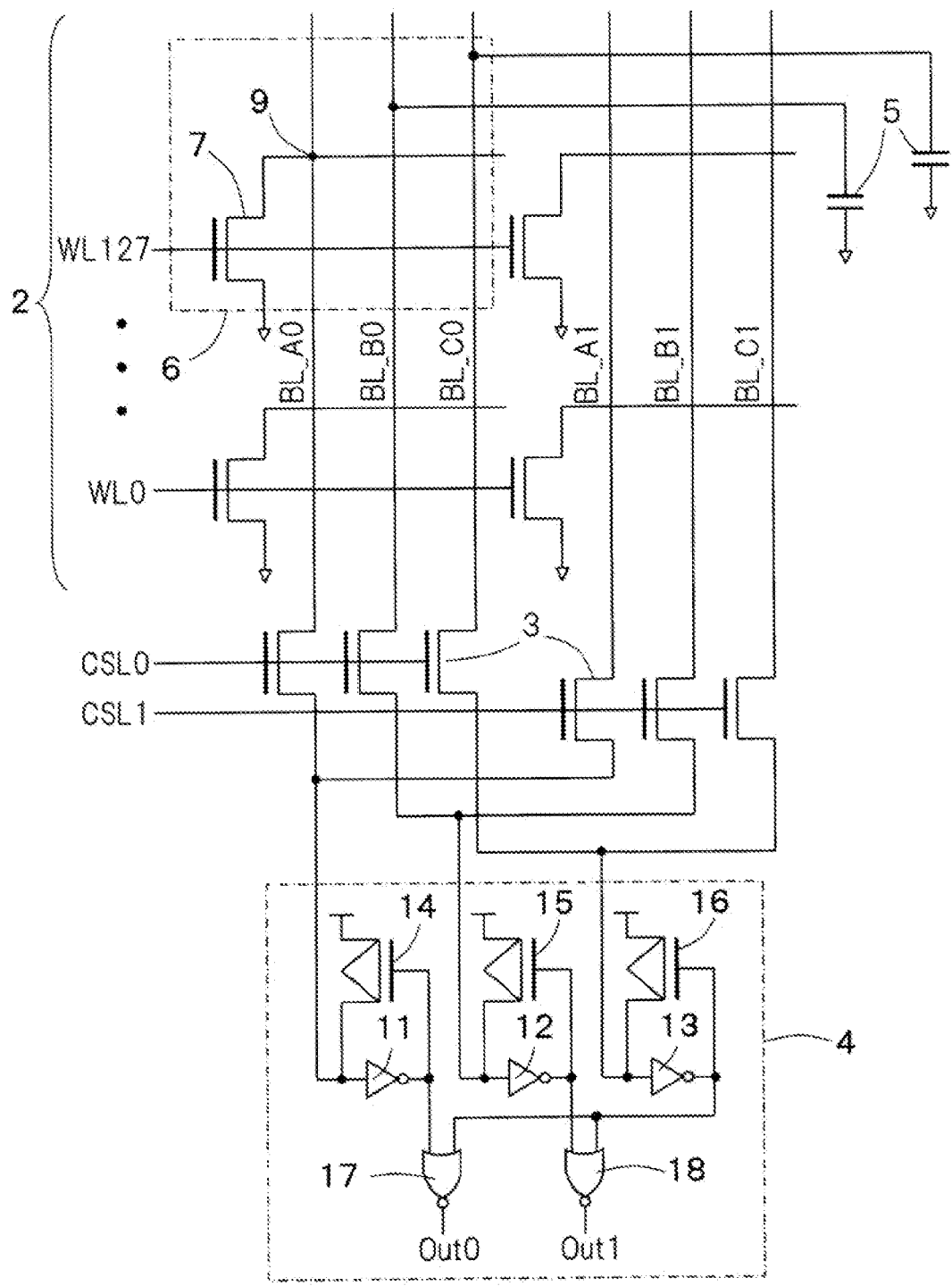
FIG. 1 is a block diagram depicting principal portions of a semiconductor memory device according to a first embodiment.

FIG. 1 is a block diagram that depicts principal portions of a semiconductor memory device 1 according to a first embodiment and the schematic configuration of mask ROM. The semiconductor memory device 1 in FIG. 1 includes a memory cell array 2, a column selection transistor 3, a read circuit 4, and a capacitance 5 for compensating for coupling noise.

The memory cell array 2 includes a plurality of word lines WLn (for example, WL0 to WL127) disposed in a row direction, a plurality of bit lines BL disposed in a column direction, and a plurality of memory cells 6 disposed in the row direction and the column direction.

Each memory cell 6 includes a cell transistor 7 and three bit lines BL_A, BL_B, and BL_C. Based on whether the leftmost bit line BL_A, the middle bit line BL_B, the rightmost bit line BL_C, or none of the three bit lines BL_A, BL_B, and BL_C is connected, to the drain (or the source) of the cell transistor 7, it is possible to store four-valued data in each memory cell 6.

Since the drain of the cell transistor 7 and the three bit lines BL_A, BL_B, and BL_C are formed in different layers: an upper layer and a lower layer, the drain of the cell transistor 7 and the three bit lines BL_A, BL_B, and BL_C are connected to each other via a via contact 9.

Figures 2, 3:
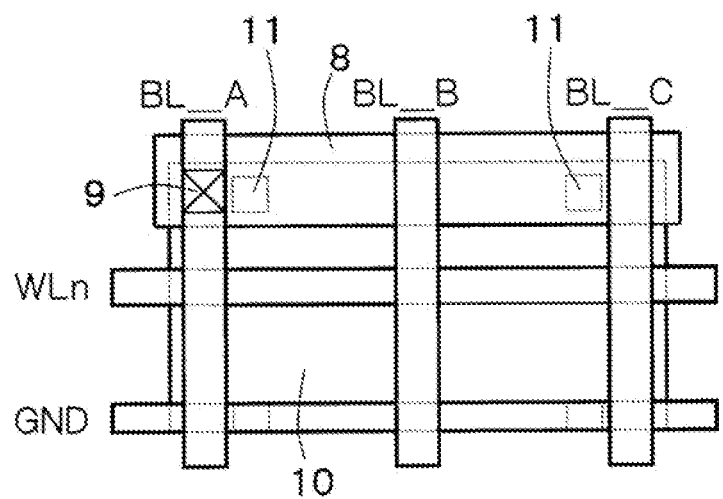
FIG. 2 is a layout pattern diagram depicting an example of a via contact.
FIG. 3 is a diagram of a truth table depicting the logics of data which is stored in a memory cell and output data of a read circuit.

FIG. 2 is a layout pattern diagram depicting an example of the via contact 9. In FIG. 2, the three bit lines BL_A, BL_B, and BL_C are disposed in a vertical (column) direction, and the word line WLn and a drain wiring layer 8 of the transistor (the drain wiring layer 8 being formed in the same layer as a metal first layer) are disposed in a horizontal (row) direction. Below the word line WLn and the metal first layer, an active region 10, in which a diffusion layer is formed, is disposed. The via contact 9 for storing particular data in the memory cell 6 connects a bit line and the drain wiring layer 8. Moreover, the active region 10 and the drain wiring layer 8 are connected to each other by a via contact 11. Incidentally, the word line WLn is formed of a polysilicon layer disposed between the metal first layer and the active region 10. Furthermore, the bit lines BL_A, BL_B, and BL_C are formed in the same layer as a metal second layer.

Additionally, the number of bit lines provided in each memory cell 6 is not limited to three. Since the gate width of the cell transistor 7 is increased as the number of bit lines is increased, it is possible to perform high-speed reading. However, if the number of bit lines is increased, the configuration of the read circuit 4 becomes complicated, which may lengthen the signal propagation delay time for the data read from the memory cell 6 to pass through the read circuit 4.

Between the memory cell array 2 and the read circuit 4, the column selection transistor 3 (see FIG. 1) is provided, and the data in the memory cell array 2 is read as a column unit (for example, 1 byte).

The read circuit 4 converts the data read (e.g., four-valued data) from each memory cell 6 into 2-bit output data Out0 and Out1. The read circuit 4 of this embodiment has three inverters 11 to 13, three PMOS transistors 14 to 16, and two NOR gates 17 and 18. Each of the inverters 11 to 13 inverts the potential of a corresponding bit line. Each of the PMOS transistors 14 to 16 performs, when the output of a corresponding one of the inverters 11 to 13 is at a low level, an operation to retain the input logic of the inverter. The output of the inverter 13 corresponding to the rightmost bit line BL_C is input to the two NOR gates 17 and 18. The output of the inverter 11 corresponding to the leftmost bit line BL_A is input to the left-hand NOR gate 17, and the output of the inverter 12 corresponding to the middle bit line BL_B is input to the right-hand NOR gate 18.

FIG. 3 is a truth table depicting the logic applied to the data BL_A, BL_B, and BL_C which is stored in the memory cell 6 and the output data Out0 and Out1 of the read circuit 4. The bit line whose data stored in the memory cell 6 is 1 is not connected to the drain of the cell transistor 7, and the bit line whose data stored in the memory cell 6 is 0 is connected to the drain of the cell transistor 7.

Figure 4A:
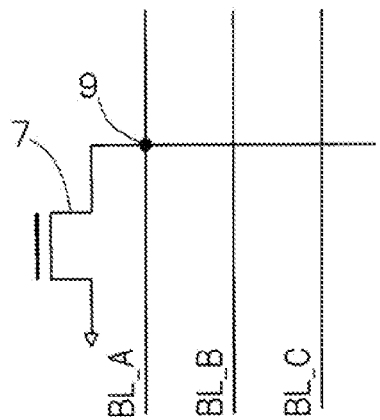
FIGS. 4A to 4C are diagrams, each depicting the connection position of a via contact of the memory cell.
Figure 4B:
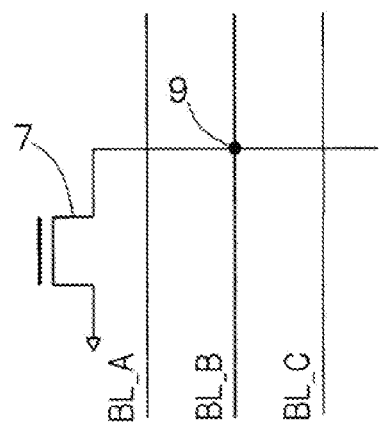
Figure 4C:
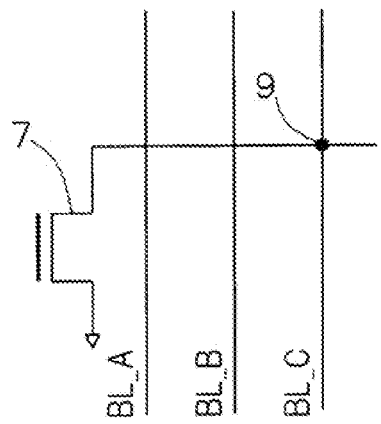

For example, if the data BL_A, BL_B, and BL_C which is stored in the memory cell 6 is (011), as depicted in FIG. 4A, only the bit line BL_A is connected to the drain of the cell transistor 7, if the data BL_A, BL_B, and BL_C which is stored in the memory cell 6 is (101), as depicted in FIG. 4B, only the bit line BL_B is connected to the drain of the cell transistor 7, and, if the data BL_A, BL_B, and BL_C which is stored in the memory cell 6 is (110), as depicted in FIG. 4C, only the bit line BL_C is connected to the drain of the cell transistor 7.

The read circuit 4 is a circuit that performs a logic operation by which the output data Out0 and Out1 follow the truth table in FIG. 3, and a specific circuit configuration in the read circuit 4 is not limited to the configuration depicted in FIG. 1. Moreover, the logic of the output data Out0 and Out1 of the read circuit 4 are also not limited to the logic of the truth table in FIG. 3. A specific circuit configuration of the read circuit 4 may change according to the correspondence relation between four-valued data which is stored in the memory cell 6 and a bit sequence of 2-bit output data.

However, in the circuit in FIG. 1, the signal propagation time is shortened by reducing the number of gate stages by using the NOR gates 17 and 18. Therefore, it is preferable to form a circuit that minimizes the number of gate stages.

The circuit in FIG. 1 depicts an example in which the drain of the cell transistor 7 is connected to the leftmost bit line BL_A and the capacitances (capacitors) 5 are connected to the middle bit line BL_B and the rightmost bit line BL_C. These capacitances 5 suppress the coupling noise among the plurality of bit lines and are each referred to as a capacitance 5 to handle coupling noise in the following description.

Figures 5, 6:
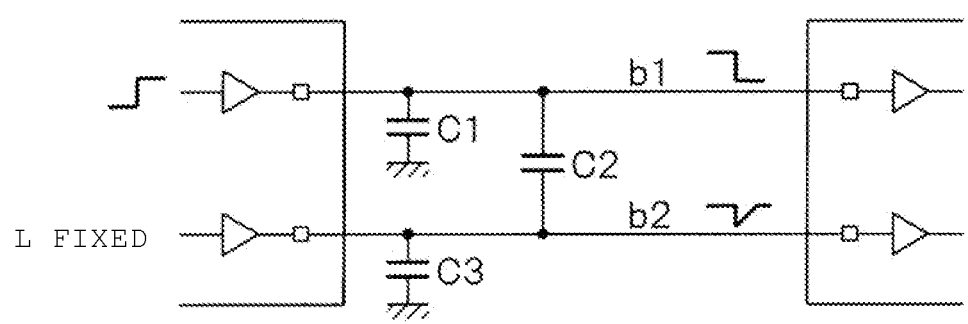
FIG. 5 is a diagram explaining coupling noise.
FIG. 6 is a diagram of a truth table of a second embodiment.

FIG. 5 is a diagram explaining the coupling noise. In FIG. 5, for simplification, the coupling noise between two adjacent lines of wiring is depicted. In FIG. 5, the coupling capacitance between these two lines of wiring b1 and b2 is denoted as C2, and the capacitances between the bit lines b1 and b2 and a ground node are denoted as C1 and C3, respectively. These capacitances C1 and C3 are all the capacitances other than the coupling capacitance C2 and also include a wiring capacitance and so forth.

If the potential of the wiring b1 in FIG. 5 suddenly decreases and becomes a potential V1, the potential of the adjacent wiring b2 also decreases by $\Delta Vx$. $\Delta Vx$ is expressed as $V1 \times C2/(C2+C3)$. (C2+C3) is the total capacitance of the wiring b2. As is clear from the above-described expression, the potential fluctuation $\Delta Vx$ of the wiring b2 caused by the coupling noise between the wiring b2 and the adjacent bit line b1 depends on a value obtained by dividing the coupling capacitance C2 by the total capacitance (C2+C3) of the wiring b2. This means that, when the total capacitance (C2+C3) of the wiring b2 is increased, the potential fluctuation $\Delta Vx$ is reduced.

Thus, in this embodiment, the capacitance 5 to handle coupling noise is added to a bit line that is considered to be affected by the coupling noise, whereby the potential fluctuation of this bit line is suppressed. This capacitance 5 is sufficient to suppress the coupling noise.

The capacitance 5 to handle coupling noise may be implemented by connecting a physical capacitor to a bit line or may be implemented as a parasitic capacitance, a wiring capacitance, or the like that is formed when a bit line is connected to another conductive layer by a via contact. As the capacitance 5 to handle coupling noise, a parasitic capacitance, a wiring capacitance, or the like that is formed by disposing a layout having the same shape as the memory cell as a dummy and connecting the layout by a via contact in the same manner as the memory cell may be used. Moreover, when a particular bit line and the drain of the cell transistor 7 are connected to each other by the via contact 9 to store data in the memory cell 6, a parasitic capacitance, a wiring capacitance, or the like formed by this via contact 9 functions also as the capacitance 5 to handle coupling noise. Therefore, a separate capacitance 5 to handle coupling noise does not have to be formed for a bit line in which the via contact 9 is connected to the drain of the cell transistor 7 to store particular data.

Moreover, as for the memory cells 6 that are adjacent to each other in a column direction, that is, in a bit line direction, when the capacitance 5 to handle coupling noise is added to a bit line or the via contact 9 is connected to a particular bit line to store particular data, a new capacitance 5 to handle coupling noise does not necessarily have to be formed in that bit line. This is because it is considered that there is little possibility that the bit line will be affected by coupling noise.

As described above, in the first embodiment, since the capacitance 5 to handle coupling noise is added to a bit line that is considered to be affected by the coupling noise, even when the potential of a bit line adjacent to this bit line significantly decreases, there is no possibility that the potential decreases accordingly, and the coupling noise may be suppressed.

Second Embodiment

In the first embodiment described above, the type of a bit line to which the capacitance 5 is added is not specified; in a second embodiment which is described below, the capacitance 5 is added only to the middle bit line BL_B of an odd number of bit lines.

For example, when three bit lines BL_A, BL_B, and BL_C are disposed in each memory cell 6, if the logical states of the output data Out0 and Out1 are set such that the logical states do not depend on the potential levels of two bit lines on both sides of the middle bit line BL_B when the middle bit line BL_B changes from a high level to a low level, even when the middle bit line BL_B changes from a high level to a low level and the potentials of the bit lines on both sides of the middle bit line BL_B fluctuate accordingly, since the logical states of the output data Out0 and Out1 are uniquely determined, the logics of the output data Out0 and Out1 do not change and no practical problem arises. Therefore, there is no need to add the capacitance 5 to handle coupling noise to the bit lines on both sides of the middle bit line BL_B. In this case, since the capacitance 5 to handle coupling noise simply has to be added only to the middle bit line BL_B, the number of bit lines to which a capacitance is added may be reduced, which facilitates manufacturing.

To keep the logical states of the output data Out0 and Out1 from depending on the potential levels of the two bit lines on both sides of the middle bit line BL_B when the middle bit line BL_B changes from a high level to a low level, as the truth table indicating the relation between the data which is stored in the memory cell 6 and the output data which is read from the read circuit 4, a truth table depicted in FIG. 6, for example, may be adopted.

In the truth table in FIG. 6, a portion of the logic of the output data Out0 and Out1 of the read circuit 4 differs from the corresponding portion of the truth table in FIG. 3. In FIG. 6, the output data Out0 and Out1 becomes 00 when the data BL_A, BL_B, and BL_C stored in the memory cell 6 is (101) and becomes 10 when the data BL_A, BL_B, and BL_C stored in the memory cell 6 is (110). That is, according to the truth table in FIG. 6, when the middle bit line BL_B is at a low level, irrespective of the potential levels of the bit lines BL_A and BL_C on both sides of the middle bit line BL_B, the read data Out0 and Out1 becomes 00. That is, when the potential of the middle bit line BL_B becomes a low level, the read data Out0 and Out1 is uniquely determined. As a result, even when the potential of the bit line BL_B decreases from a high level to a low level and the potentials of the bit lines BL_A and BL_C decrease accordingly, there is no possibility that the logic of the read data Out0 and Out1 change, which makes it possible to prevent an unintended activation. For example, in the read circuit 4 in FIG. 1 that operates in accordance with the truth table in FIG. 3, when the potential of the middle bit line BL_B is at a low level, if the potential of the bit line BL_A changes to a low level due to the coupling noise, the logic of the read data Out0 changes from an original high level to a low level. In the truth table in FIG. 6, such a thing does not happen.

Figure 7:
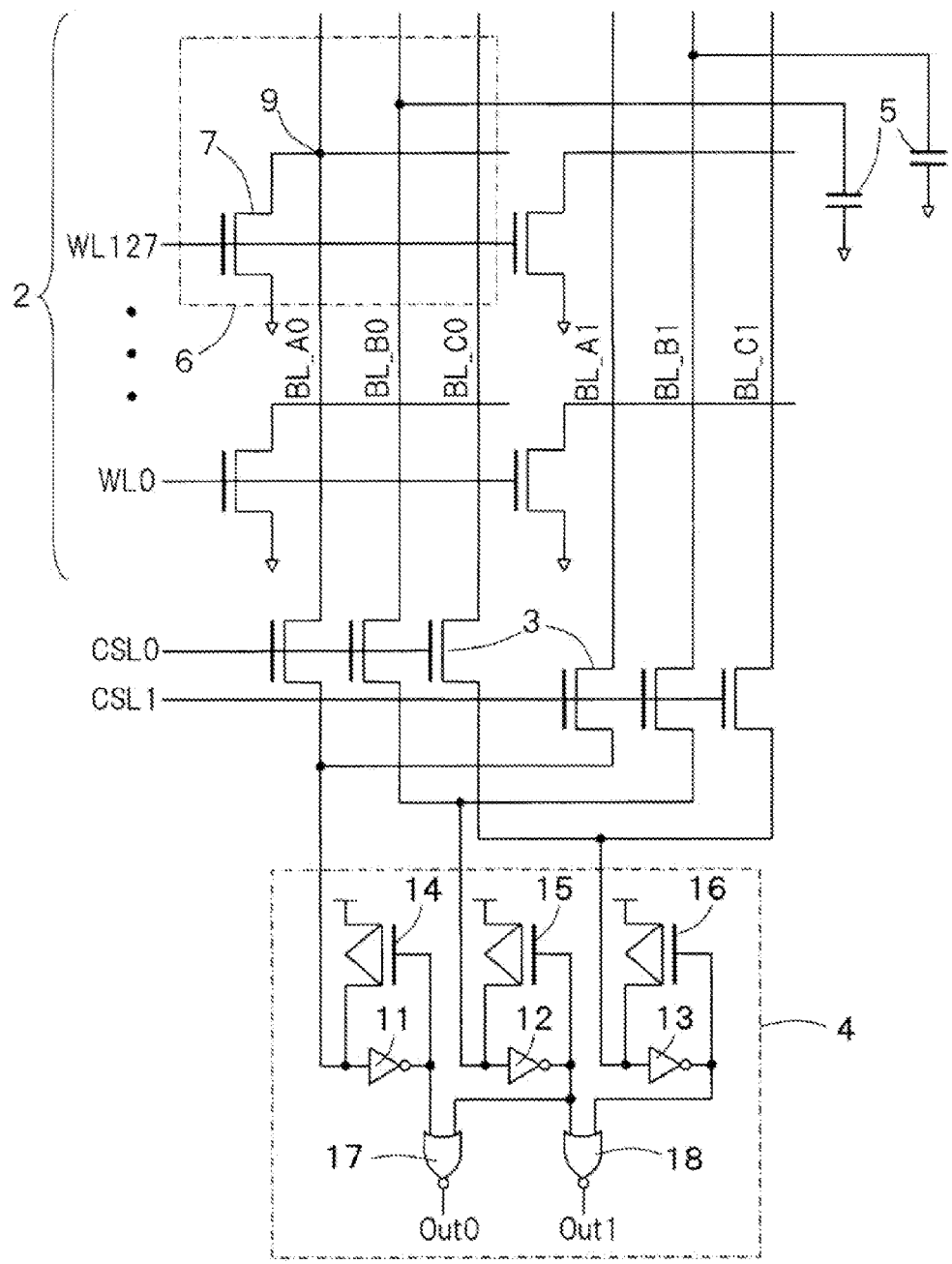
FIG. 7 is a circuit diagram of principal portions of a semiconductor memory device according to the second embodiment.

FIG. 7 is a circuit diagram illustrating principal portions of a semiconductor memory device 1 according to the second embodiment. The circuit configuration of a read circuit 4 in FIG. 7 performs logical operation in accordance with the truth table in FIG. 6. As is clear from a comparison between the read circuit 4 in FIG. 7 and the read circuit 4 in FIG. 1, a portion of the connection on the input side of the NOR gates 17, 18 is changed. Also in the read circuit 4 in FIG. 7, by using the NOR gates 17 and 18, the number of gate stages is reduced.

In the second embodiment, as described above, even when the potentials of the bit lines on both sides of the middle bit line BL_B change due to the influence of the coupling noise caused when the potential of the middle bit line BL_B is changed, although the logic of the read data Out0 and Out1 are not affected, there is a need to add the capacitance 5 to handle coupling noise to the middle bit line BL_B as in the first embodiment. As is the case with the first embodiment, this capacitance may be implemented by connecting a physical capacitor to the bit line BL_B or by increasing a parasitic capacitance, a wiring capacitance, or the like by connection with another conductive layer by a via contact.

Incidentally, the number of bit lines provided in the memory cell 6 is not limited to three. Since the feature of this embodiment lies in that the capacitance 5 to handle coupling noise is added only to the middle bit line BL_B, the total number of bit lines provided in the memory cell 6 simply has to be an odd number.

As described above, in the second embodiment, since the logic in the read circuit 4 are set in such a way that, when the potential of the middle bit line BL_B of an odd number of bit lines is changed from a high level to a low level, even when the potentials of the other bit lines are changed, this change does not affect the output data of the read circuit 4, it is simply necessary to add the capacitance 5 to handle coupling noise only to the middle bit line BL_B, which handles the coupling noise easily.

Third Embodiment

The feature of a third embodiment which is described below is a location in which the capacitance 5 to handle coupling noise is formed.

In the first and second embodiments described above, a location in which the capacitance 5 to handle coupling noise is formed is not limited to a particular location. However, it is preferable to minimize an increase in the area of the memory cell 6 even when this capacitance 5 is formed.

Figure 8:
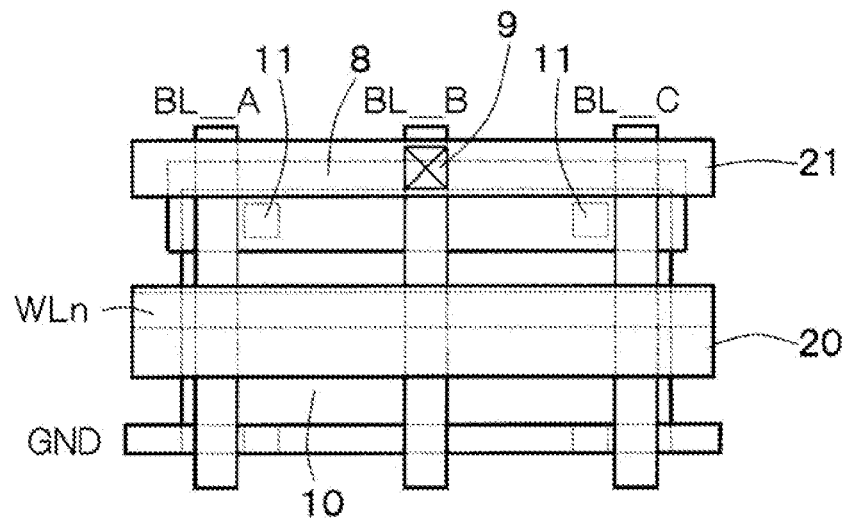
FIG. 8 is a diagram depicting an example in which what is obtained by connecting a conductive layer and a bit line in a metal third layer by a via contact is used as a capacitance to handle coupling noise.

FIG. 8 depicts an example in which the conductive layer 21 provided in a metal third layer (a so-called M3 layer), and the bit line BL_B are connected to each other by the via contact 9 to form the capacitance 5 to handle coupling noise. The conductive layer 21, the bit line BL_B, and the parasitic capacitance or the wiring capacitance generated by the via contact 9 form the capacitance 5. In the metal third layer, a lining layer 20 of a word line is provided, and the conductive layer 21 is provided between the lining layers 20 of the word lines. As a result, it is possible to form the capacitance 5 to handle coupling noise without increasing the area of the memory cell 6.

Incidentally, if an empty region that forms the conductive layer 21 in a floating state lies in a layer other than the metal third layer, the conductive layer 21 may be formed in this empty region and connected to a bit line by the via contact 9.

As described above, in the third embodiment, since the conductive layer 21 in a floating state for forming the capacitance 5 to handle coupling noise is formed in the empty region in the metal third layer or the like, by connecting the conductive layer 21 and the bit line by the via contact 9, it is possible to form easily the capacitance 5 to handle coupling noise. Moreover, the via contact 9 connects a desired bit line and the conductive layer 21 when necessary in units of the memory cell 6, which increases the flexibility of a place in which the capacitance 5 to handle coupling noise is formed.

There is a trade-off problem between a capacitance of the bit line and reading rate of a memory cell. Therefore, increasing the capacitance of the bit line improves withstanding coupling noise and degrades the reading rate. A memory cell in which a bit line is connected to a cell transistor has a junction capacitance of the cell transistor and a wiring capacitance of a metal first layer which connect the bit line to the cell transistor. Accordingly, the memory cell has a sufficient withstanding coupling noise. Because of that, such a memory cell does not need to have the capacitance to handle coupling noise and degradation in operating rate of the memory cell can be minimized.

Fourth Embodiment

A fourth embodiment, which is described below, may be implemented by combining any one of the first to third embodiments and has the effect that the potential of the bit line whose potential level is changed due to the influence of the coupling noise between the bit line and the adjacent bit line is forcedly returned to an original potential.

Figure 9:
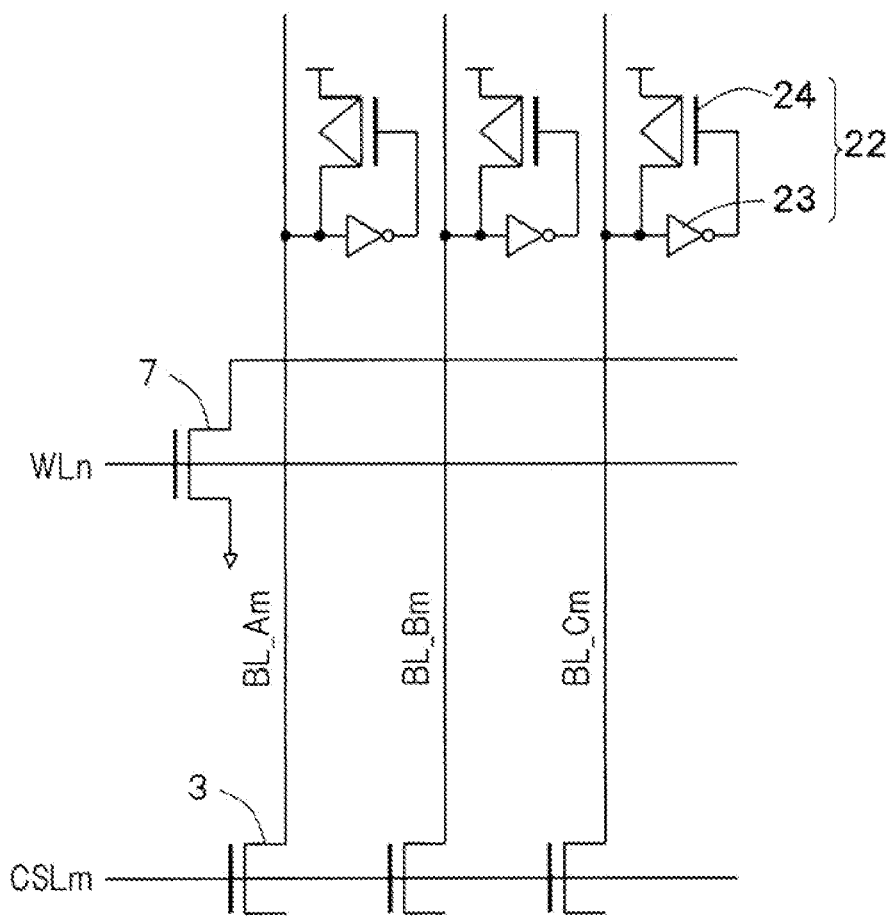
FIG. 9 is a circuit diagram of principal portions of a semiconductor memory device according to a fourth embodiment.

FIG. 9 is a circuit diagram illustrating principal portions of a semiconductor memory device 1 according to the fourth embodiment. The semiconductor memory device 1 in FIG. 9 includes a potential holding circuit 22 that is connected to at least one of a plurality of bit lines provided in the memory cell 6.

In a predetermined period from the start to the completion of lowering of the potential of a corresponding bit line, the potential holding circuit 22 performs operation to raise the potential of this bit line. The potential holding circuit 22 includes an inverter 23 that inverts the potential of a bit line and a PMOS transistor 24 that performs operation to hold the potential of the bit line in accordance with the output of the inverter 23.

For example, assume that the potential of a bit line connected to the potential holding circuit 22 starts to decrease due to the influence of the coupling noise between the bit line and the adjacent bit line. In this case, since the output of the inverter 23 is still at a low level and the PMOS transistor 24 enters an ON state, the potential holding circuit 22 operates to raise the potential of the bit line. On the other hand, when the potential of this bit line reaches a complete low level, the output of the inverter 23 changes to a high level and the PMOS transistor 24 is turned off, and the bit line potential holding operation by the potential holding circuit 22 is not performed. As described above, the potential holding circuit 22 performs the potential holding operation only in a predetermined period from the start of temporary lowering of the potential of a bit line due to the influence of the coupling noise to the completion of lowering of the potential of the bit line.

The potential holding circuit 22 in FIG. 9 may be provided individually in all bit lines or, as described in the second embodiment, if it is necessary simply to handle coupling noise only for the middle bit line BL_B, the potential holding circuit 22 may be connected only to the middle bit line BL_B.

Although the potential holding circuit 22 in FIG. 9 is connected to a bit line between the memory cell 6 and the column selection transistor 3, the potential holding circuit 22 may be connected to a bit line between the column selection transistor 3 and the read circuit 4.

As described above, in the fourth embodiment, since the potential holding circuit 22 that raises the potential of a bit line when the potential of the bit line starts to decrease due to the influence of the coupling noise between the bit line and the adjacent bit line is provided, it is possible to minimize the influence of the coupling noise.

Incidentally, the potential holding circuit 22 may be provided along with the capacitance 5 to handle coupling noise described in the first to third embodiments described above, or only the potential holding circuit 22 may be added to a bit line without adding this capacitance 5 to the bit line.

Fifth Embodiment

In a fifth embodiment a potential raising circuit 25 is connected to at least one bit line in the memory cell 6 in place of the potential holding circuit 22 according to the fourth embodiment or along with the potential holding circuit 22.

Figure 10A:
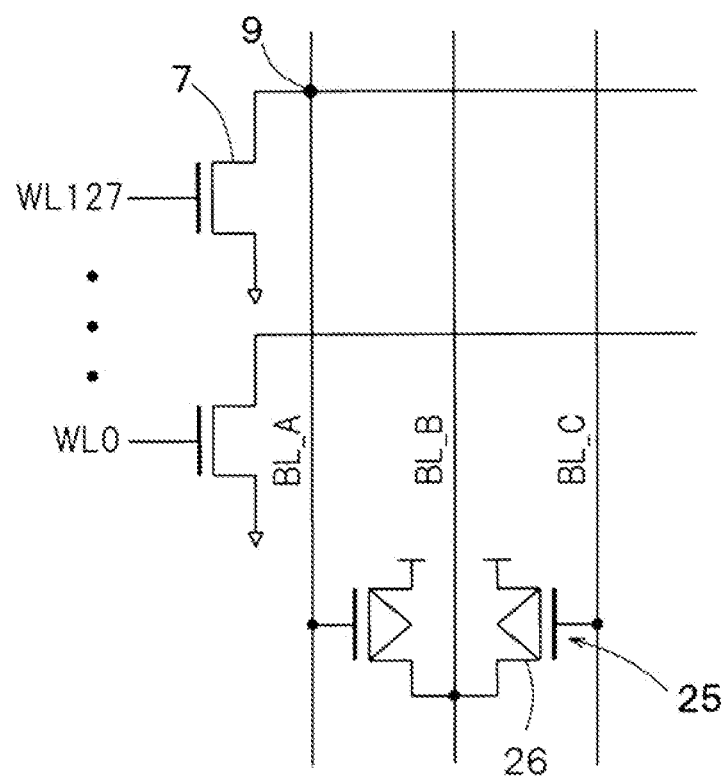
FIGS. 10A and 10B are circuit diagrams of principal portions of a semiconductor memory device according to a fifth embodiment.

FIG. 10A is a circuit diagram of principal portions of a semiconductor memory device 1 according to the fifth embodiment. The semiconductor memory device 1 in FIG. 10A includes a potential raising circuit 25 that is connected to at least one of a plurality of bit lines provided in the memory cell 6.

The potential raising circuit 25 includes a PMOS transistor 26 that raises the potential of a target bit line when the potential of the adjacent bit line decreases. In the example in FIG. 10A, there are three bit lines BL_A, BL_B, and BL_C and the middle bit line BL_B is a bit line whose potential has to be raised. Two PMOS transistors 26 are provided, and the gate of one PMOS transistor 26 is connected to the leftmost bit line BL_A and the drain is connected to the middle bit line BL_B. The gate of the other PMOS transistor 26 is connected to the rightmost bit line BL_C and the drain is connected to the middle bit line BL_B.

As described above, by providing two PMOS transistors 26, if the potential of at least one of the bit lines on both sides of the middle bit line BL_B decreases, the PMOS transistor 26 whose gate is connected to the bit line with a decreased potential operates in such a way as to be turned ON, and raises the potential of the middle bit line BL_B.

Figure 10B:
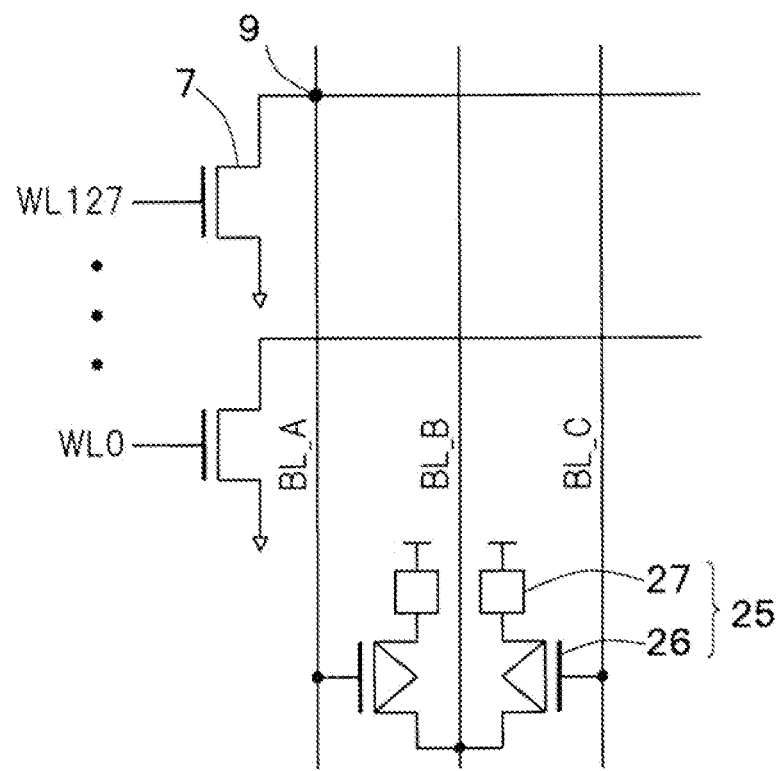

According to the potential raising circuit 25 in FIG. 10A, if the potential of at least one of the bit lines on either side of the middle bit line BL_B decreases, operation to raise the potential of the middle bit line BL_B is performed. However, if the potential of the middle bit line BL_B decreases by the read operation, due to the influence of the coupling noise, the potentials of the bit lines on both sides of the middle bit line BL_B also decrease, which may cause the potential raising circuit 25 to raise the potential of the middle bit line BL_B. Thus, as depicted in FIG. 10B, a switching circuit 27 that performs switching between a state in which the source of the PMOS transistor 26 and the power-supply voltage node are brought into conduction and a state in which the source of the PMOS transistor 26 and the power-supply voltage node are brought out of conduction may be provided such that, if the potential of the middle bit line BL_B becomes lower than the potentials of the bit lines on both sides of the middle bit line BL_B, the switching circuit 27 is interrupted to prevent the PMOS transistor 26 from being turned on. When the switching circuit 27 is interrupted, the source potential of the PMOS transistor 26 becomes inconstant (floating) and the PMOS transistor 26 is not turned ON.

As described above, in the fifth embodiment, since the potential raising circuit 25 is connected between a bit line and the adjacent bit line, the bit line whose potential may decrease due to the influence of the coupling noise between the bit line and the adjacent bit line, if the potential of the adjacent bit line decreases, it is possible to raise the potential of a target bit line, which makes it possible to suppress the influence of the coupling noise.

The potential raising circuit 25 can be combined with the first to fourth embodiments described above. Moreover, it is also possible to connect only the voltage raising circuit according to the fifth embodiment to a bit line without applying the first to fourth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array in which memory cells are disposed in a matrix; a plurality of bit lines for each respective memory cell in the matrix, each respective memory cell being connectable to every bit line in the plurality of bit lines, the plurality of bit lines for each respective memory cell including at least three bit lines; and
   a capacitance, which is large enough to suppress coupling noise between bit lines in the plurality of bit lines, connected to at least one bit line in the plurality of bit lines, wherein the plurality of bit lines has an odd number of bit lines, and the capacitance is connected to a middle bit line in the odd number of bit lines.

2. The semiconductor memory device according to claim 1, wherein the middle bit line is a bit line other than a bit line that is connected to a drain or a source of a cell transistor.

3. The semiconductor memory device according to claim 1, wherein the capacitance is formed by a contact that extends in a direction intersecting a plane in which the plurality of bit lines is disposed and connects at least one of the plurality of bit lines to a conductive layer that is in a floating state.

4. The semiconductor memory device according to claim 1, further comprising:
   a read circuit that reads data stored in each memory cell via the plurality of bit lines, wherein
   data is stored in each memory cell such that data read from the read circuit is uniquely determined irrespective of a potential of any bit line other than the middle bit line when the middle bit line is connected to a drain or a source of a cell transistor of the memory cell.

5. The semiconductor memory device according to claim 1, further comprising:
   a potential holding circuit configured to raise a potential of at least one bit line in the plurality of bit lines for a predetermined period.

6. The semiconductor memory device according to claim 1, further comprising:
   a potential raising circuit configured to raise the potential of one bit line in the plurality bit lines when a potential of the one bit line becomes lower than a potential of a second bit line in the plurality of bit lines.

7. The semiconductor memory device according to claim 3, wherein the contact connects the one of the plurality of bit lines to the conductive layer in accordance with data stored in each memory cell.

8. A memory cell array, comprising:
   a plurality of memory cells disposed in row and column directions, each memory cell in the plurality of memory cells including a cell transistor connectable to at least one bit line in a plurality of bit lines including at a first bit line, a second bit line, and a third bit line, each bit line extending in the column direction, the second bit line being between the first and third bit lines in the row direction; and
   a read circuit configured to read data stored in each memory cell via a plurality of inputs respectively corresponding to each bit line in the plurality of bit lines, wherein
   a capacitance is connected to each bit line not connected to the memory cell, the capacitance having a value that reduces coupling noise, wherein the plurality of bit lines has an odd number of bit lines, and the capacitance is connected to a middle bit line in the odd number of bit lines.

9. The memory cell array according to claim 8, wherein the capacitance comprises a connection to a conductive layer in a floating state.

10. The memory cell array according to claim 8, wherein, for each input of the read circuit, the read circuit further includes:
    a inverter having an input terminal connected to the input of the read circuit, and
    a transistor having a source, a drain, and a gate, wherein the input of the inverter is connected to the drain of the transistor, and an output of the inverter is connected to the gate of the transistor, and a positive voltage reference is connected to the sources of the transistor.

11. The memory cell array according to claim 10, wherein the read circuit further includes:
    a first NOR gate having a first input terminal connected an output of the inverter that is connected to the input of the read circuit corresponding to the first bit line and a second input terminal connected to an output of the inverter that is connected to the input of the read circuit corresponding to the second bit line, and
    a second NOR gate having a first input terminal connected to an output of the inverter that is connected to the input of the read circuit correspond to the third bit line and a second input terminal that is connected to the output of the inverter corresponding to the second bit line.

12. The memory cell array according to claim 8, further comprising:
    at least one potential holding circuit connected to a bit line in the plurality of bit lines, wherein
    the at least one potential holding circuit includes an inverter, and a transistor having a source, a drain, and a gate, an input of the inverter being connected to the drain of the transistor, the source being connected to a positive voltage reference, and the gate being connected to an output of the inverter.

13. The memory cell array according to claim 8, further comprising:
    a potential holding circuit connected to the second bit line, wherein
    the potential holding circuit includes first and second transistors, each having a source, a drain, and a gate, the drains of the first and second transistors being connected to the second bit line, the sources of the first and second transistors being connected to a positive voltage reference, the gate of the first transistor being connected to the first bit line, and the gate of the second transistor being connected to the third bit line.

14. A memory cell array, comprising:
    a plurality of memory cells disposed in rows and columns, each memory cell in the plurality of memory cells including a cell transistor connectable to one of an odd number of bit lines provided for each column of memory cells and extending in a column direction;
    a read circuit configured to read data stored in each memory cell via an odd number of inputs corresponding to the odd number of bit lines provided for each column of memory cells; and
    a capacitance connected to a middle bit line within the odd number of bit lines for at least one column of memory cells, the capacitance having a value that reduces coupling noise on the middle bit line.

15. The memory cell array according to claim 14, wherein, for each input of the read circuit, the read circuit includes:
    an inverter having an input connected to a respective input of the read circuit; and a transistor having a source, a drain, and a gate, wherein the input of the inverter is connected to the drain of the transistor, the source is connected to a positive voltage reference, and the gate is connected to an output of the inverter.

16. The memory cell array according to claim 15, wherein the read circuit further includes a logic circuit connected to the inverter outputs, the logic circuit having an output value that depends on the change of the middle bit line from a high to low level and not changes on the other bit lines.

17. The memory cell array according to claim 14, wherein the capacitance is a wiring capacitance.

18. A semiconductor memory device, comprising:
a memory cell array in which memory cells are disposed in a matrix; a plurality of bit lines for each respective memory cell in the matrix, each respective memory cell being connectable to every bit line in the plurality of bit lines, the plurality of bit lines for each respective memory cell including at least three bit lines; and
a capacitance, which is large enough to suppress coupling noise between bit lines in the plurality of bit lines, connected to at least one bit line in the plurality of bit lines, wherein the capacitance is formed by a contact that extends in a direction intersecting a plane in which the plurality of bit lines is disposed and connects at least one of the plurality of bit lines to a conductive layer that is in a floating state.

19. The semiconductor device according to claim 18, wherein the contact connects the one of the plurality of bit lines to the conductive layer in accordance with data stored in each memory cell.

* * * * *